(12) United States Patent
Xiong

(10) Patent No.: US 7,773,702 B2
(45) Date of Patent: Aug. 10, 2010

(54) GAIN CONTROL FOR A RECEIVER IN A MULTI-CARRIER COMMUNICATION SYSTEM

(75) Inventor: Wei Xiong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/120,742

(22) Filed: May 2, 2005

(65) Prior Publication Data

US 2005/0276359 A1 Dec. 15, 2005

Related U.S. Application Data

(60) Provisional application No. 60/568,111, filed on May 3, 2004.

(51) Int. Cl.
*H04L 27/08* (2006.01)
*H03F 3/45* (2006.01)

(52) U.S. Cl. .................................. 375/345; 330/254

(58) Field of Classification Search ................ 375/345, 375/316; 455/136, 138, 245.1, 250.1, 240.1; 330/254, 278
See application file for complete search history.

(56) References Cited

U.S. PATENT DOCUMENTS

| 6,721,547 | B2* | 4/2004 | Husted et al. ............ 455/226.1 |
| 6,742,677 | B2 | 6/2004 | Petit et al. |
| 7,024,169 | B2* | 4/2006 | Ciccarelli et al. ......... 455/232.1 |
| 2002/0160734 | A1 | 10/2002 | Li et al. |
| 2002/0186799 | A1* | 12/2002 | Sayeed ......................... 375/345 |
| 2002/0191717 | A1* | 12/2002 | Yamanaka et al. .......... 375/345 |
| 2003/0002434 | A1* | 1/2003 | Bott et al. ..................... 370/210 |
| 2003/0027538 | A1 | 2/2003 | Masumoto et al. |
| 2003/0142734 | A1* | 7/2003 | Black et al. ................. 375/149 |
| 2004/0037378 | A1 | 2/2004 | Komori et al. |

(Continued)

FOREIGN PATENT DOCUMENTS

EP 1331780 7/2003

(Continued)

OTHER PUBLICATIONS

International Preliminary Report on Patentabiltiy-PCT/US05/015288, IPEA/US-Apr. 12, 2006.

(Continued)

*Primary Examiner*—Khai Tran
(74) *Attorney, Agent, or Firm*—Sandip S. Minhas; Gerald P. Joyce, III

(57) ABSTRACT

A receiver in an OFDM communication system includes a power detector and a gain controller. The power detector detects for total received power of a received OFDM signal, e.g., by computing the power of the data samples from an ADC and averaging the power. The gain controller adjusts the gain of the receiver in discrete gain steps and in one direction, e.g., from the lowest gain state to the highest gain state, based on the detected total received power. The gain controller initializes the receiver to the lowest gain state. Thereafter, the gain controller detects for low total received power, e.g., by comparing the detected total received power against a predetermined threshold. The gain controller transitions to a higher gain state if low total received power is detected and maintains the current gain state otherwise.

8 Claims, 4 Drawing Sheets

U.S. PATENT DOCUMENTS

2005/0201497 A1* 9/2005 Ma et al. .................. 375/345

FOREIGN PATENT DOCUMENTS

| JP | 06-216796 | 8/1997 |
| JP | 2001-223603 | 8/2001 |
| JP | 2002-359532 | 12/2002 |
| JP | 2003-008676 | 1/2003 |
| WO | 9709794 | 3/1997 |
| WO | 02067420 | 8/2002 |

OTHER PUBLICATIONS

International Search Report - PCT/US05/015288, International Search Authority - European Patent Office, Sep. 23, 2005.

Writen Opinion- PCT/US05/015288, International Search Authority - European Patent Office, Sep. 23, 2005.

* cited by examiner

GAIN CONTROL FOR A RECEIVER IN A MULTI-CARRIER COMMUNICATION SYSTEM

This application claims the benefit of provisional U.S. Application Ser. No. 60/568,111 entitled "A Method and Apparatus for Gain Stepping in an OFDM System with Large Peak-to-Average Power Ratio," filed May 3, 2004 and is expressly incorporated herein.

BACKGROUND

I. Field

The present disclosure relates generally to communication, and more specifically to techniques for controlling the gain of a receiver in a communication system.

II. Background

A multi-carrier communication system employs multiple carriers for data transmission. These multiple carriers may be provided by orthogonal frequency division multiplexing (OFDM), discrete multi-tone (DMT), or some other multi-carrier modulation techniques. OFDM partitions the overall system bandwidth into multiple (K) orthogonal frequency subbands. These subbands are also called tones, subcarriers, bins, and so on. Each subband is associated with a respective carrier that may be modulated with data. The carriers for the K subbands may be independently modulated with data, and the K modulated carriers are added together to generate an OFDM signal.

OFDM has certain desirable characteristics, including the ability to combat multipath effects which are prevalent in a terrestrial communication system. However, a major drawback with OFDM is a high peak-to-average power ratio (PAPR) for the OFDM signal, i.e., the ratio of the peak power to the average power for the OFDM signal can be high. The high PAPR results from possible in-phase (or coherent) addition of all the carriers when they are independently modulated with data. In fact, it can be shown that the peak power can be up to K times greater than the average power for OFDM.

The high PAPR for the OFDM signal normally requires a receiver to have a larger dynamic range than for other modulated signals such as CDMA in order to handle the wide fluctuation in the power of a received OFDM signal. The larger dynamic range can complicate the design of the receiver. The high PAPR also makes it challenging to accurately estimate the power of the received OFDM signal. A reasonably accurate received power estimate may be needed to operate the receiver at a proper gain state in order to achieve good performance.

There is therefore a need in the art for techniques to control the gain of a receiver in a multi-carrier communication system.

SUMMARY

Techniques for controlling the gain of a receiver in a multi-carrier communication system are described herein. To simplify the receiver design, the gain of the receiver may be adjusted in discrete gain steps. Multiple gain states are defined for the receiver. Each gain state is associated with a specific discrete gain step and a specific range of signal levels for a received OFDM signal.

In an embodiment, the receiver includes a detector and a controller. The detector detects for total received power of the received OFDM signal, e.g., by computing the power of the data samples from an analog-to-digital converter (ADC) and averaging the power. This total received power includes noise power and signal power, where the signal power may be masked by the noise power if the received OFDM signal is near or below the noise floor. The total received power is the average power of the noise and signal instead of the instantaneous power of the noise and signal. In an embodiment, the controller adjusts the gain of the receiver in one direction, from the lowest gain state to the highest gain state, based on the detected total received power. The controller initializes the receiver to the lowest gain state. Thereafter, the controller detects for low total received power, e.g., by comparing the detected total received power against a predetermined threshold and declaring low total received power if the detected total received power is below the threshold. The controller transitions to a higher gain state if low total received power is detected and maintains the current gain state otherwise. In other embodiments, the controller may adjust the gain of the receiver (1) in one direction from the highest gain state to the lowest gain state or (2) in either direction from the current gain state.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
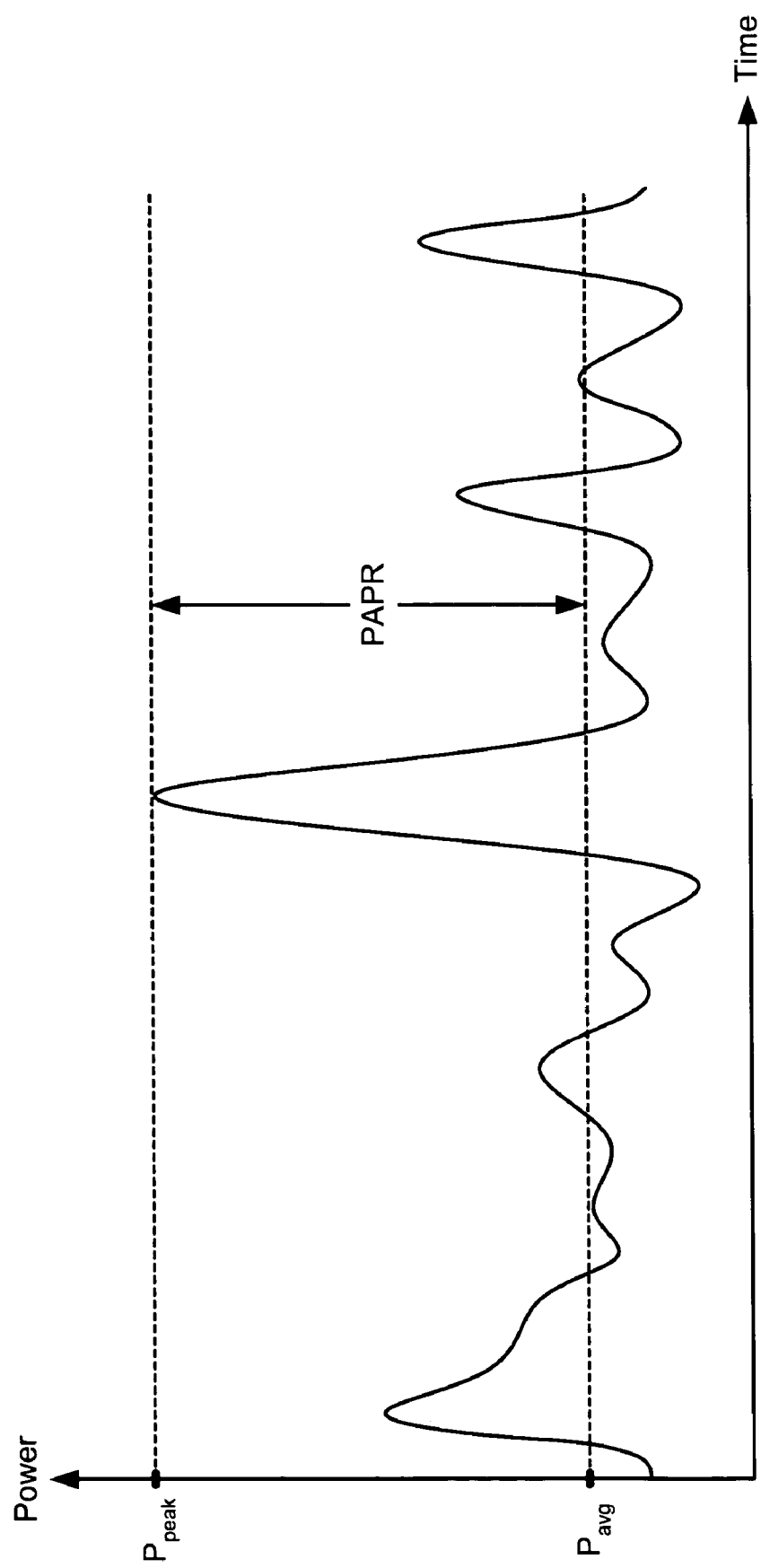
FIG. 1 shows a plot of the power of an OFDM signal.

FIG. 1 shows a plot of the power of an OFDM signal. The horizontal axis denotes time and the vertical axis denotes power. For OFDM, up to K carriers for the K total frequency subbands may be independently modulated with data. The modulated carriers are added together to form the OFDM signal. The modulated carriers may add coherently (i.e., in-phase), in which case the OFDM signal will have a large amplitude. The peak power of the OFDM signal can be many times greater than the average power. The exact value for the PAPR depends on various factors. Furthermore, the PAPR value that is of interest is often not the absolute peak value but some statistical value, e.g., the PAPR value under which the instantaneous power remains below 99% of the time. In the description herein, the terms "signal level", "power level", "power", and "amplitude" are used interchangeably.

A receiver in an OFDM system is typically required to operate under stringent operating conditions. First, the receiver needs to handle the relatively high PAPR of an OFDM signal, which may be 10 to 15 decibels (dB) for a typical OFDM system. Second, the receiver often needs to support high data rates, which require high signal-to-noise-and-interference ratios (SNRs). For example, the highest data rate may require an SNR of 25 dB or more. Third, the receiver may receive the OFDM signal with a wide range of received signal levels, e.g., between −10 dBm to −100 dBm. Fourth, the receiver should maintain the quantization noise from an ADC at least 10 dB below the thermal noise in order to mitigate degradation due to quantization.

The receiver is often required to have a large dynamic range in order to handle various factors such as high PAPR, high SNR requirement, wide received signal range, and quantization noise. Dynamic range refers to the difference between the highest and lowest signal levels that a given circuit block can handle and achieve the required performance. Different circuit blocks in the receiver may have different dynamic range requirements. The total dynamic range ($DRR_{total}$) for the receiver may be roughly estimated as:

$$DRR_{total} = \Delta Signal + PAPR + SNR_{max} + \Delta Noise, \quad Eq\ (1)$$

where $\Delta Signal$ is the range of received signal levels, $SNR_{max}$ is the required SNR for the highest data rate, and $\Delta Noise$ is the difference between the quantization noise and thermal noise. For an OFDM system with $\Delta Signal=90$ dB, PAPR=15 dB, $SNR_{max}=25$, and $\Delta Noise=10$, the total dynamic range for the receiver (which is also the required dynamic range for the ADC without any gain control) may be as much as 140 dB.

An ADC usually does not have sufficient range to cover the total dynamic range for the receiver. For example, the ADC may have only 40 to 60 dB of dynamic range. Two techniques may be used to reduce the required ADC range. First, the received OFDM signal may be amplified with one or more continuously variable gain amplifiers (VGAs) to maintain the signal level at the ADC input approximately constant. Continuous VGAs are often complex to design, have poor linearity over a large gain range, and may need to be characterized (e.g., for gain versus control voltage) to achieve good performance. Second, the received OFDM signal may be amplified with one or more discrete gain blocks to maintain the signal level at the ADC input within a predetermined range that is a fraction of the total dynamic range. The ADC is then relied upon to handle signal variation within the predetermined range. Discrete gain blocks are often simpler to design and easier to operate than continuous VGAs.

Figure 2:
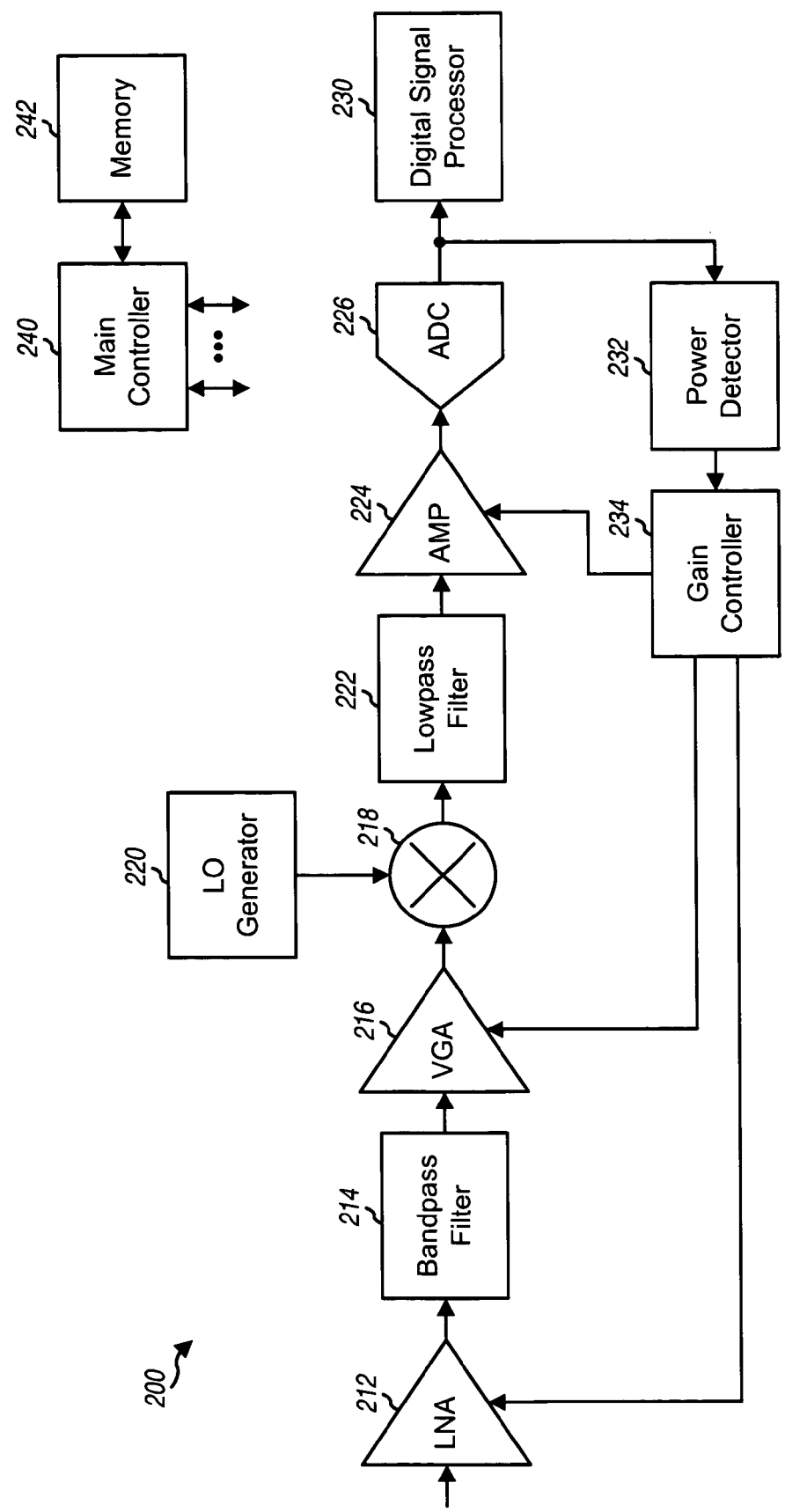
FIG. 2 shows a block diagram of a receiver in an OFDM system.

FIG. 2 shows a block diagram of a receiver 200 suitable for use in an OFDM system. Within receiver 200, a low noise amplifier (LNA) 212 receives and amplifies an input radio frequency (RF) modulated signal with a gain of $G_{lna}$ selected by a gain controller 234. A bandpass filter 214 filters the signal from LNA 212 to pass signal components in the band of interest and to remove out-of-band noise and undesired signal components. Bandpass filter 214 may be implemented with a surface acoustic wave (SAW) filter or some other filter. A variable gain amplifier (VGA) 216 amplifies the signal from bandpass filter 214 with a gain of $G_{vga}$ selected by gain controller 234 and provides an amplified RF signal.

A receiver may implement a super-heterodyne architecture or a direct-to-baseband architecture. In the super-heterodyne architecture, the input RF modulated signal is frequency downconverted in multiple stages, e.g., from RF to an intermediate frequency (IF) in one stage, and then from IF to baseband in another stage. In the direct-to-baseband architecture, the input RF modulated signal is frequency downconverted from RF directly to baseband in one stage. The super-heterodyne and direct-to-baseband architectures may use different circuit blocks and/or have different circuit requirements. For clarity, the following description is for the direct-to-baseband architecture.

A mixer 218 receives and frequency downconverts the amplified RF signal from VGA 216 with a local oscillator (LO) signal from an LO generator 220 and provides a downconverted signal. The frequency of the LO signal is selected such that the signal component in an RF channel of interest is downconverted to baseband or near baseband. A lowpass filter 222 filters the downconverted signal to pass the signal components in the RF channel of interest and to remove noise and undesired signal components that may have been generated by the downconversion process. An amplifier (AMP) 224 amplifies the signal from lowpass filter 222 with a gain of $G_{amp}$ and provides an analog baseband signal. An ADC 226 digitizes the analog baseband signal and provides data samples to a digital signal processor (DSP) 230. DSP 230 performs digital signal processing (e.g., OFDM demodulation, decoding, and so on) on the data samples, as specified by the system.

A main controller 240 directs the operations of various processing units within receiver 200. A memory unit 242 stores data and program codes for main controller 240.

FIG. 2 shows a specific design for receiver 200. In general, a receiver may perform signal conditioning using one or more stages of amplifier, filter, mixer, and so on, which may be arranged differently from the design shown in FIG. 2. Furthermore, a receiver may employ other circuit blocks not shown in FIG. 2 for signal conditioning.

A power detector 232 and gain controller 234 control the gains of the variable gain circuit blocks within receiver 200. These variable gain circuit blocks may include LNA 212, VGA 216 and amplifier 224, as shown in FIG. 2. The gains of different and/or other circuit blocks (e.g., mixer 218) may also be controlled.

The overall gain of receiver 200 may be adjusted in discrete gain steps based on an automatic gain control (AGC) loop. Multiple (M) gain states may be defined for the receiver. Each gain state corresponds to a different overall gain that is obtained from a specific gain being used for each of the variable gain circuit blocks within the receiver. For example, the overall gain ($G_{total}$) for the receiver may be expressed as:

$$G_{total} = G_{lna} + G_{vga} + G_{amp} + G_{other}, \quad Eq\ (2)$$

where $G_{lna}$, $G_{vga}$, and $G_{amp}$ are the gains for LNA 212, VGA 216, and amplifier 224, respectively, and $G_{other}$ is the gain for all other circuit blocks in the receive path prior to ADC 226. The gains are given in units of dB in equation (2).

The lowest gain state may correspond to the lowest overall gain for the receiver, which may be obtained with the lowest gain settings for LNA 212, VGA 216, and amplifier 224. The highest gain state may correspond to the highest overall gain for the receiver, which may be obtained with the highest gain settings for LNA 212, VGA 216, and amplifier 224. Other gain states correspond to different overall gains obtained with different combinations of gain settings for LNA 212, VGA 216, and amplifier 224. The overall gain for each gain state is typically distributed across the circuit blocks in a manner to achieve good performance in terms of linearity, dynamic range, sensitivity, and so on. The gain setting for each circuit block for each gain state may be stored in a look-up table.

The number of gain states (M) is determined by various factors such as, for example, the total dynamic range for the receiver, the dynamic range of the ADC, the desired operating characteristics for the AGC loop, and so on. The dynamic range of the ADC is determined by the type and the design of the ADC selected for use and is typically fixed. If the total dynamic range is very large (e.g., up to 140 dB for the example described above) compared to the dynamic range of the ADC, then many gain states may be needed.

The M gain states are typically defined such that they cover overlapping portions of the total dynamic range for the receiver. For example, the highest gain state may cover a subrange of 0 dB to 40 dB of the total dynamic range, the next lower gain state may cover a subrange of 20 dB to 60 dB, the next lower gain state may cover a subrange of 40 dB to 80 dB, and so on, and the lowest gain state may cover a subrange of 100 dB to 140 dB of the total dynamic range.

The receiver operates in one of the M gain states at any given moment. The current gain state may be selected as described below. Power detector 232 determines the average power of the data samples from ADC 226 and provides the average power ($P_{avg}$) to gain controller 234. Gain controller 234 selects the proper gain state for the receiver based on the average power and the current gain state. Gain controller 234 determines the gain settings to use for the circuit blocks for the current gain state (e.g., based on the look-up table) and provides the appropriate controls to set the gains for these circuit blocks to the designated settings.

A uni-directional or a bi-directional gain selection mechanism may be used to select the proper gain state for the receiver. A bi-directional mechanism can transition from the current gain state to either a higher gain state or a lower gain state. For the bi-directional mechanism, the power detector typically detects for two conditions: (1) high signal or saturation and (2) low or no signal. The bi-directional mechanism selects a lower gain state if high signal/saturation is detected, selects a higher gain state if low/no signal is detected, and maintains the current gain state otherwise. A uni-directional mechanism can transition from the current gain state to another gain state in a specified direction. For a downward mechanism, the power detector typically detects for the high signal/saturation condition. The downward mechanism selects a lower gain state if high signal/saturation is detected and maintains the current gain state otherwise. For an upward mechanism, the power detector typically detects for the low/no signal condition. The upward mechanism selects a higher gain state if low/no signal is detected and maintains the current gain state otherwise. The uni-directional mechanism is typically faster than the bi-directional mechanism because only one condition is detected for the uni-directional mechanism whereas two conditions are detected for the bi-directional mechanism.

For both the uni-directional and bi-directional mechanisms, the amount of time needed to select the proper gain state is largely dependent on how quickly the desired condition(s) can be accurately detected. In many systems, the detection of the high signal/saturation condition can be achieved much faster than the detection of the low/no signal condition. The reason for this is because it is usually harder to determine the absence of something than the presence of that something, which assumes that the desired signal has similar peak-to-average characteristics as the noise since, in the absence of a signal, only noise is detected.

However, an OFDM signal has a large PAPR that is often much larger than the PAPR of the noise. The instantaneous power of the OFDM signal varies greatly. Therefore, to detect the high signal/saturation condition, the power detector typically needs to average a large number of data samples for the OFDM signal before it can confidently declare high signal/saturation. On the other hand, with the OFDM signal absent, the power detector simply measures the noise level. The power detector can average fewer number of data samples to determine the noise power, since the PAPR of the thermal noise is much less than the PAPR of the OFDM signal.

For OFDM, the power detector can detect the total received power of the received OFDM signal, e.g., based on the data samples from the ADC. This total received power includes noise power and signal power, where the signal power may be masked by the noise power if the received OFDM signal is near or below the noise floor. This total received power is also the average power of the noise and signal instead of the instantaneous power of the noise and signal. The power detector may compare the total received power against a predetermined threshold and declare low total received power if the total received power is below the threshold. The threshold may be set at a short distance above the noise floor so that the power detector is essentially detecting for noise (or the low/no signal condition) because the high PAPR of the OFDM signal can easily push the total received power above the threshold when the OFDM signal is near this threshold.

In an embodiment, an upward uni-directional gain selection mechanism is used to select the proper gain state for the receiver. This upward mechanism starts at the lowest gain state, detects for low total received power condition, transitions to a higher gain state whenever this condition is detected, and resets to the lowest gain state whenever a reset condition is detected. The upward mechanism can reduce the amount of time needed to select the proper gain state because the detection of low total received power can be achieved faster than the detection of high signal/saturation in an OFDM system. An embodiment of the upward mechanism is described below.

Figure 3:
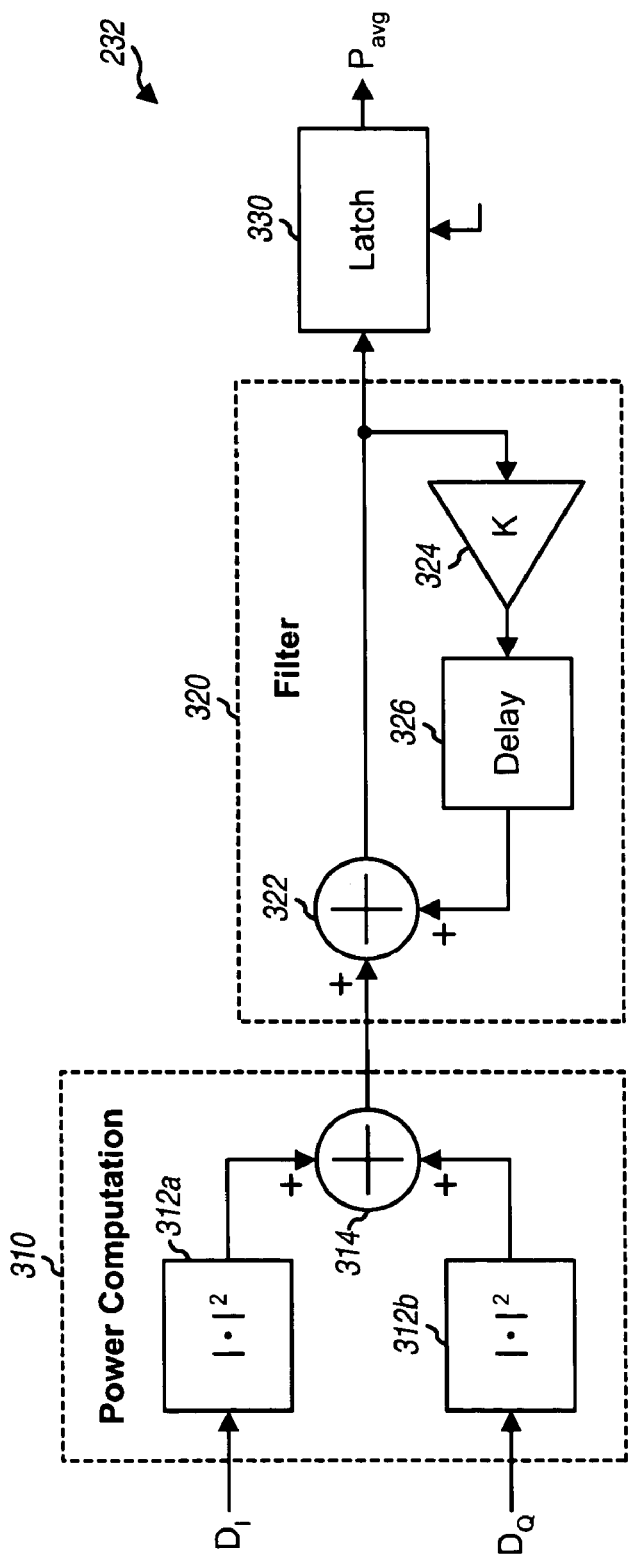
FIG. 3 shows a block diagram of a power detector.

FIG. 3 shows a block diagram of an embodiment of power detector 232, which includes a power computation unit 310, a filter 320, and a latch 330. Unit 310 receives inphase samples ($D_I$) and quadrature samples ($D_Q$), which are the inphase and quadrature components, respectively, of the complex-valued data samples from ADC 226. Within unit 310, a squarer 312a squares each inphase sample, and a squarer 312b squares each quadrature sample. A summer 314 sums the outputs of squarers 312a and 312b and provides a power value for each sample period, which may be expressed as:

$$P(n) = D_I^2(n) + D_Q^2(n), \quad \text{Eq (3)}$$

where $D_I(n)$ and $D_Q(n)$ are the inphase and quadrature samples, respectively, for sample period n, and P(n) is the power value for sample period n.

For the embodiment shown in FIG. 3, filter 320 is implemented with a first order infinite impulse response (IIR) filter. Within filter 320, a summer 322 receives and sums the power value from unit 310 with the output of a delay unit 326 and provides a filtered value. A gain unit 324 scales the filtered value with a gain of K and provides the scaled value to delay unit 326. Delay unit 326 stores the scaled value and provides a delay of one sample period. The response of filter 320 in the z-domain may be expressed as:

$$H(z) = \frac{z}{z - K}, \quad \text{Eq (4)}$$

where 0<K<1. The gain K determines the filter bandwidth and is selected to provide the desired amount of averaging.

In general, filter 320 may be implemented with any type of filter and any filter order and may have any bandwidth. For example, filter 320 may be an IIR filter, a finite impulse response (FIR) filter, or some other filter. Filter 320 may be a first order filter, as shown in FIG. 3, or a higher order filter.

Latch 330 receives the filtered value from filter 320 and latches the filtered value based on a strobe signal. The output of latch 330 is the average power ($P_{avg}$) for the data samples and is indicative of the total power at the output of ADC 226. The average power is updated whenever the strobe signal is activated. The time duration over which the power of the data samples is averaged may be determined based on various factors such as, e.g., the manner in which data is transmitted in the system, the desired settling time for the AGC loop, and so on. For example, the average power may be computed based on the data samples in each packet, the data samples received in each frame or time slot, and so on.

FIG. 3 shows a specific embodiment for determining the average power of the data samples. The average power may also be estimated in other manners. For example, the data samples may be compared against a threshold value, and the number of data samples that fall below the threshold value may be counted. The percentage of data samples that fall below the threshold value may be used as a rough estimate of the average power. This method of estimating average power requires less computation and may be sufficiently accurate.

Figure 4:
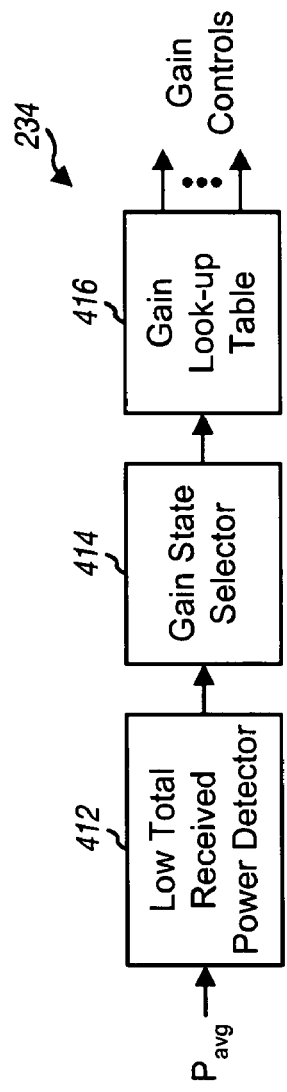
FIG. 4 shows a block diagram of a gain controller.

FIG. 4 shows a block diagram of an embodiment of gain controller 234. Within gain controller 234, a low total received power detector 412 receives the average power from power detector 232, compares the average power against a predetermined threshold, and declares low total received power if the average power is less than the threshold. A gain state selector 414 receives the output from detector 412 and determines whether to maintain the current gain state, transition to the next higher gain state, or reset to the lowest gain state. Selector 414 may implement a state machine to select the proper gain state for the receiver, as described below. A gain look-up table 416 receives the current gain state from selector 414 and provides appropriate gain controls for the variable gain circuit blocks (e.g., LNA 212, VGA 216 and amplifier 224 in FIG. 2).

Figure 5:
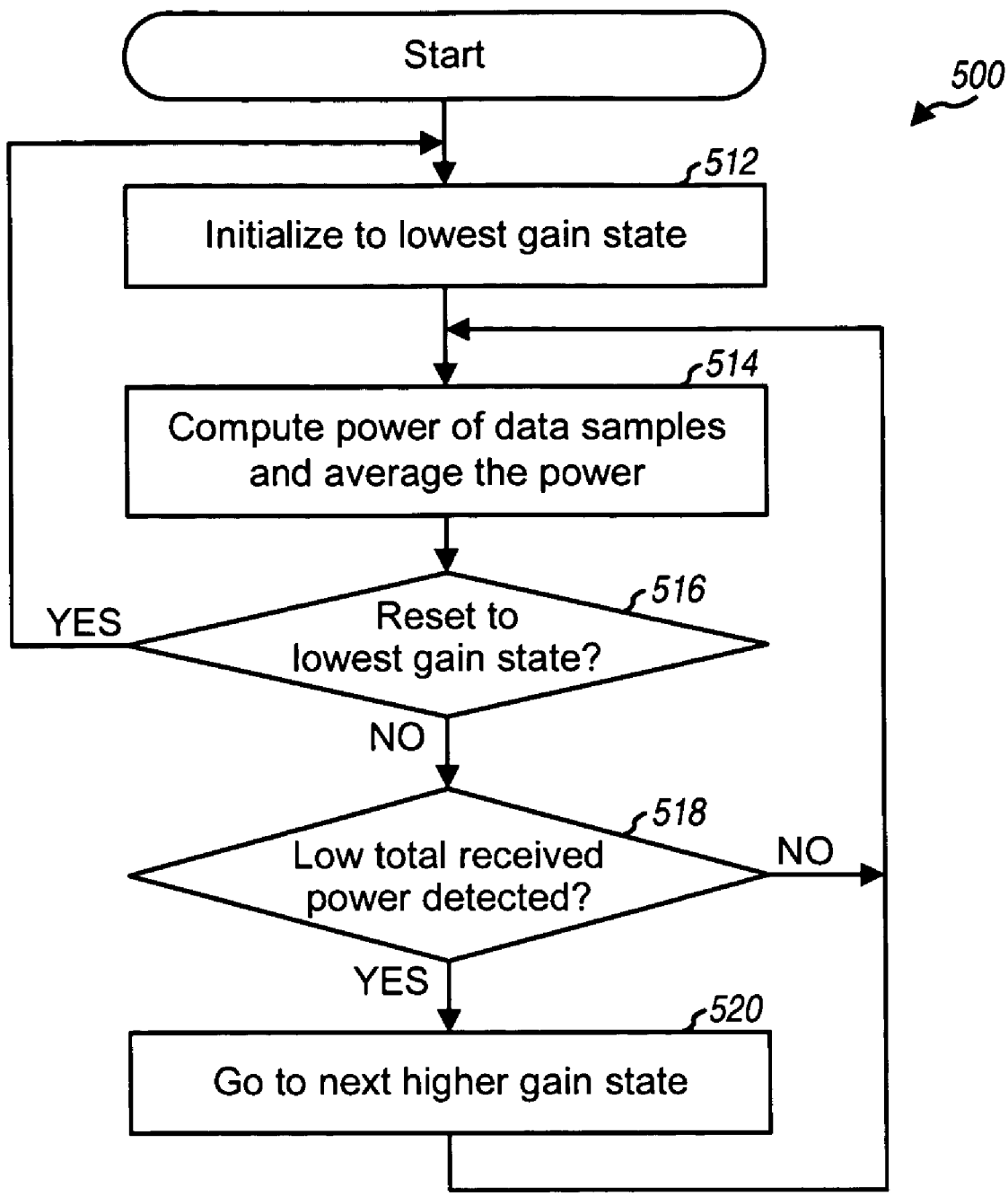
FIG. 5 shows a process for selecting the gain state for the receiver using an upward mechanism.

FIG. 5 shows a process 500 for selecting the proper gain state for the receiver using the upward mechanism. Process 500 may be performed by power detector 232 and gain controller 234 in FIG. 2.

Initially, the lowest gain state is selected for the receiver (block 512). For each update interval (e.g., each data packet or each frame or time slot), the power of the data samples is computed and averaged to obtain the average power for the data samples (block 514). A determination is then made whether to reset the receiver to the lowest gain state (block 516). The lowest gain state may be selected if, for example, an unusually large signal is detected (e.g., a predetermined percentage or more of the data samples are above the threshold), the receiver switches to receiving data from another transmitter, and so on. If the answer is 'Yes' for block 516, then the process returns to block 512 and the lowest gain state is selected for the receiver. Otherwise, if the answer is 'No' for block 516, then a determination is made whether low total received power is detected (block 518). This condition may be the declared if the average power is below the predetermined threshold. If low total received power is detected in block 518, then the next higher gain state is selected for the receiver (block 520), and the process then returns to block 514. Otherwise, if low total received power is not detected in block 518, then the current gain state is maintained and the process returns to block 514.

The upward mechanism can provide a faster response time than the bi-directional and downward mechanisms for an OFDM signal in most scenarios. The improvement may be illustrated by an example. For this example, the receiver has five gain states. The power detector is able to detect additive Gaussian white noise in T seconds. The same power detector is able to detect high signal/saturation for an OFDM signal with a PAPR of 13 dB in approximately 3T seconds. The upward mechanism can reach the correct gain state in a maximum of 4T seconds. This assumes that the receiver starts off in the lowest gain state, needs to reach the highest gain state, and is able to transition to the next higher gain state every T seconds. The bi-directional mechanism can reach the correct gain state in a maximum of 6T seconds. This assumes that the receiver starts off in the middle gain state, needs to reach the highest or lowest gain state, and is able to transition to the next higher or lower gain state every 3T seconds. The downward mechanism can reach the correct gain state in a maximum of 12T seconds. This assumes that the receiver starts off in the highest gain state, needs to reach the lowest gain state, and is able to transition to the next lower gain state every 3T seconds. The time saving achieved by the upward mechanism increases with more gain states.

In certain operating scenarios, it may be advantageous to use the downward mechanism or the bi-directional mechanism. For example, the downward mechanism may be used in (1) a system with a lower PAPR, (2) for gain control based on a transmission (e.g., a pilot transmission) that is designed to have a low PAPR, and so on. The bi-directional mechanism may be used, for example, after the nominal gain state has been reached and for all or many scenarios in which the downward mechanism may be used. For the downward and bi-directional mechanisms, the gain controller may detect for the high total received power condition, e.g., based on the average power from the power detector. The gain controller may compare the average power against a high threshold and declaring high total received power if the average power exceeds the high threshold. The average power includes mostly signal power when high total received power is detected. The gain controller may select a lower gain state whenever high total received power is detected.

FIGS. 2 through 5 show a specific embodiment in which the power of the data samples is computed and averaged to obtain the average power. This average power is indicative of the total power at the ADC output. This embodiment is desirable since the power computation and averaging may be performed digitally on the data samples. In general, the total received power of a modulated signal to be gain controlled may be measured at any point in the receive path from the LNA to the ADC. For example, a power detector may measure the total received power of the filtered signal at the output of lowpass filter 222, the analog baseband signal at the input of ADC 226, and so on in FIG. 2.

The gain control techniques described herein may be implemented by various means. For example, these techniques may be implemented in hardware, software, or a combination thereof. For a hardware implementation, the processing units used to perform gain control (e.g., power detector 232 and gain controller 234 in FIG. 2) may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a software implementation, the techniques may be implemented with modules (e.g., procedures, functions, and so on) that perform the functions described herein. The software codes may be stored in a memory unit (e.g., memory unit 242 in FIG. 2) and executed by a processor (e.g., main controller 240). The memory unit may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for a communication system, comprising: a detector operative to detect for total received power of a modulated signal; and a controller operative to adjust a gain of a receiver in only one direction, from a lowest gain to a highest gain, in discrete gain steps, based on the detected total received power, and reset the gain to the lowest gain if the detected total received power exceeds a high threshold, wherein the gain of the receiver is initially set to the lowest gain; wherein the controller is operative to detect if the total received power is below a low threshold, to transition to a higher gain state if the total received power is below the low threshold, and to maintain a current gain state if the total received power is between the low threshold and the high threshold.

2. The apparatus of claim 1, wherein the detector is operative to compute power of data samples for the modulated signal and to average the power of the data samples to obtain the detected total received power.

3. The apparatus of claim 1, wherein the modulated signal is generated with orthogonal frequency division multiplexing (OFDM).

4. A method of controlling gain in a communication system, comprising: detecting for total received power of a modulated signal; and adjusting a gain of a receiver in only one direction, from a lowest gain to a highest gain, in discrete gain steps, based on the detected total received power, and reset the gain to the lowest gain if the detected total received power exceeds a high threshold, wherein the gain of the receiver is initially set to the lowest gain; wherein the adjusting the gain of the receiver in discrete gain steps comprises: detecting if the total received power is below a low threshold, transitioning to a higher gain state if the total received power is below the low threshold, and maintaining a current gain state if the total received power is between the low threshold and the high threshold.

5. An apparatus for a communication system, comprising: means for detecting for total received power of a modulated signal; and means for adjusting a gain of a receiver in only one direction, from a lowest gain to a highest gain, in discrete gain steps, based on the detected total received power, and reset the gain to the lowest gain if the detected total received power exceeds a high threshold, wherein the gain of the receiver is initially set to the lowest gain; wherein the means for adjusting the gain of the receiver in discrete gain steps comprises: means for detecting if the total received power is below a low threshold, means for transitioning to a higher gain state if the total received power is below the low threshold, and means for maintaining a current gain state if the total received power is between the low threshold and the high threshold.

6. An apparatus for a communication system, comprising: a detector operative to detect for total received power of a modulated signal generated with orthogonal frequency division multiplexing (OFDM) and having a high peak-to-average power ratio (PAPR); and a controller operative to adjust a gain of a receiver in only one direction, from a lowest gain to a highest gain, in discrete gain steps, based on the detected total received power, and reset the gain to the lowest gain if the detected total received power exceeds a high threshold, wherein the gain of the receiver is initially set to the lowest gain; wherein the controller is operative to detect if the total received power is below a low threshold, to select a higher gain step if the total received power is below the low threshold, and to maintain a current gain state if the total received power is between the low threshold and the high threshold.

7. A method of controlling gain in a communication system, comprising: detecting for total received power of a modulated signal generated with orthogonal frequency division multiplexing (OFDM) and having a high peak-to-average power ratio (PAPR); and adjusting a gain of a receiver in only one direction, from a lowest gain to a highest gain, in discrete gain steps, based on the detected total received power, and resetting the gain to the lowest gain if the detected total received power exceeds a high threshold, wherein the gain of the receiver is initially set to the lowest gain; wherein the adjusting the gain of the receiver in discrete gain steps comprises: detecting if the total received power is below a low threshold, selecting a higher gain step if the total received power is below the low threshold, and maintaining a current gain step if the total received power is between the low threshold.

8. An apparatus for a communication system, comprising: means for detecting for total received power of a modulated signal generated with orthogonal frequency division multiplexing (OFDM) and having a high peak-to-average power ratio (PAPR); and means for adjusting a gain of a receiver in only one direction, from a lowest gain to a highest gain, in discrete gain steps, based on the detected total received power, and resetting the gain to the lowest gain if the detected total received power exceeds a high threshold, wherein the gain of the receiver is initially set to the lowest gain; wherein the means for adjusting the gain of the receiver in discrete gain steps comprises: means for detecting if the total received power is below a low threshold, means for selecting a higher gain step if the total received power is below the low threshold, and means for maintaining a current gain step if the total received power is between the low threshold and the high threshold.

* * * * *